United States Patent [19]  [11] 4,357,417
Bartko et al.  [45] Nov. 2, 1982

[54] HIGH RESOLUTION LITHOGRAPHY USING PROTONS OR ALPHA PARTICLES

[75] Inventors: John Bartko, Monroeville; Patrick E. Felice, Hempfield Township, Westmoreland County; Phillip D. Blais, Washington Township, Fayette County, all of Pa.

[73] Assignee: Westinghouse Electric Corp., Pittsburgh, Pa.

[21] Appl. No.: 251,648

[22] Filed: Apr. 6, 1981

Related U.S. Application Data

[63] Continuation-in-part of Ser. No. 32,797, Apr. 24, 1979, abandoned.

[51] Int. Cl.³ ............... A61K 27/02; G03F 5/00
[52] U.S. Cl. ..................... 430/323; 430/322; 250/492.1; 250/492.2
[58] Field of Search ............... 430/322, 323, 325; 250/492.1, 492.2, 492

[56] References Cited

U.S. PATENT DOCUMENTS 4,004,997  1/1977  Tsukamoto et al. ............ 250/492.1
4,158,141  6/1979  Seliger et al. .................... 250/492.2
4,282,437  8/1981  Boie ................................ 250/492.3

Primary Examiner—John E. Kittle
Assistant Examiner—John L. Goodrow
Attorney, Agent, or Firm—J. B. Hinson

[57] ABSTRACT

A method of lithographically forming a pattern on a surface is disclosed. The surface on which the pattern is to be formed is first coated with a resist layer. A mask preferably consisting of a beryllium of foil and a pattern gold layer affixed thereto is then positioned in overlying relationship to the resist layer. The thickness of the beryllium foil is selected such that it is transparent to high energy particles of a preselected energy while the combination of the pattern gold areas and the beryllium foil is impervious to these particles. A flood beam of high energy particles is directed such that it impinges on the beryllium foil thereby exposing the resist in areas not protected by the combination of the beryllium foil and the gold. The resist layer is processed to produce a patterned layer.

13 Claims, 7 Drawing Figures

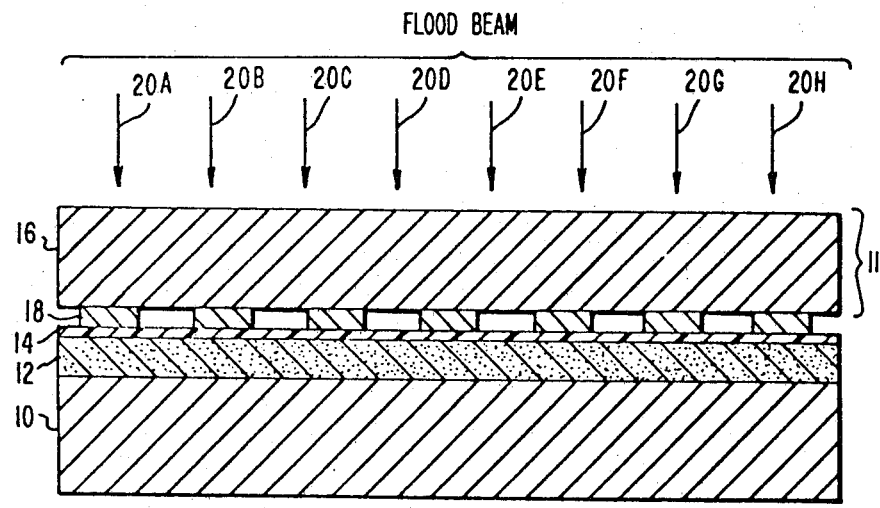
FIG. 1
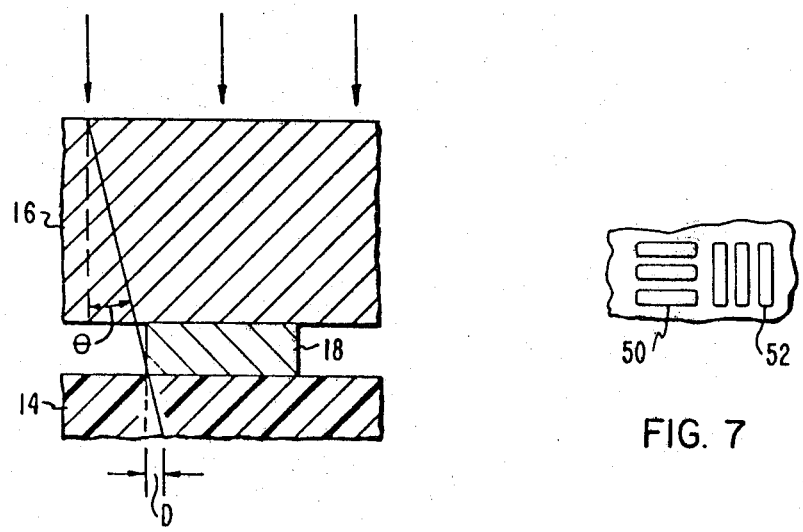
FIG. 4
FIG. 7

HIGH RESOLUTION LITHOGRAPHY USING PROTONS OR ALPHA PARTICLES

CROSS-REFERENCE TO RELATED APPLICATION

This is a continuation-in-part of Ser. No. 032,797 filed Apr. 24, 1979 now abandoned.

BACKGROUND OF THE INVENTION

1. Field of the Invention

The invention relates generally to lithographic processes and more particularly lithographic processes using a metal mask and heavy high energy particles.

2. Description of the Prior Art

Photo lithographic techniques are widely used in the semiconductor art. Typical prior art processes utilize a mask which included transparent and non-transparent regions. The mask is positioned in overlying relationship with a photo-sensitive (resist) layer. Ultraviolet light is used to expose the portions of the photo-sensitive layer which underlies the transparent portions of the mask to change the molecular structure of these portions. This process has the characteristics that the masks themselves are relatively fragile and the resolution of the system is primarily limited by diffraction of the ultraviolet light. Alternative techniques have been developed using focused electron beams and X-ray which circumvent the diffraction problem. While these processes substantially improve the resolution, they are relatively expensive in that they require sophisticated equipment and have limited throughput.

SUMMARY OF THE INVENTION

The preferred embodiment of the invention provides a process for forming a pattern in a resist layer using high energy particles such as alpha particles or protons. In practicing the invention, a mask comprising a metal foil and a patterned metal layer affixed thereto is positioned in overlying relationship with the resist layer. A flood beam of high energy particles is directed to impinge upon the mask. The foil is transparent to the high energy particles while the combination of the foil and the patterned metal layer is substantially impervious to the particles. Portions of the particles penetrate the foil and impinge upon the resist layer causing a change in the molecular structure of portions of the resist layer. The change in the molecular structure of portions of the resist layer is utilized to selectively remove portions of the resist layer to produce the desired pattern.

BRIEF DESCRIPTION OF THE DRAWINGS

FIG. 1 is a drawing illustrating the use of the process comprising the invention;

FIG. 4 is a diagram illustrating the resolution of the disclosed process;

FIG. 7 is a portion of a mask used in an actual reduction to practice of the disclosed process.

DESCRIPTION OF THE PREFERRED EMBODIMENTS

Figure 2:
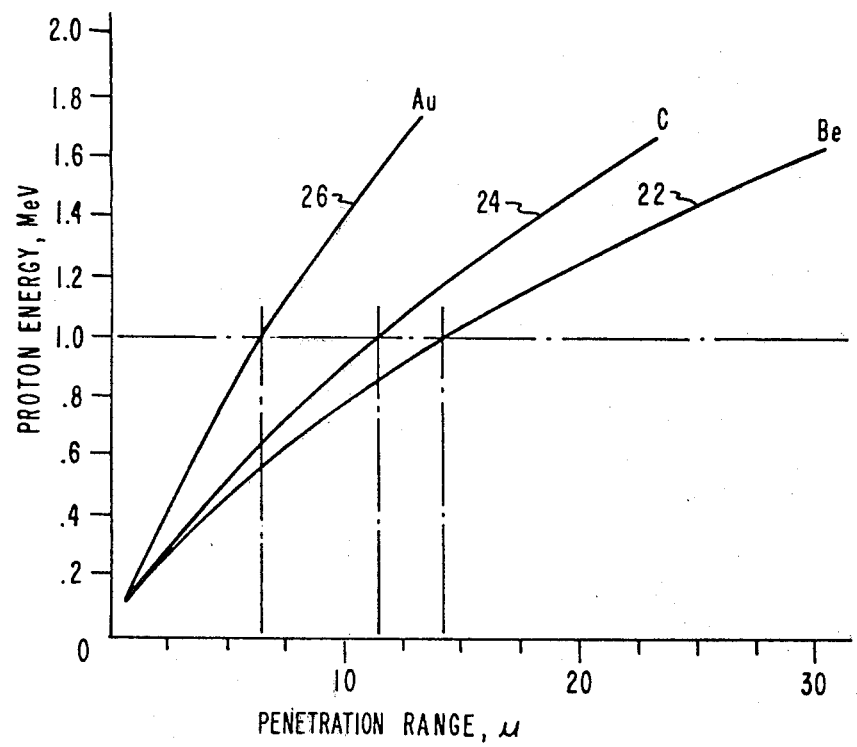
FIG. 2 is a chart illustrating the penetration range of protons in beryllium, carbon and gold.

FIG. 1 is a drawing illustrating the use of the process comprising the preferred embodiment of the invention. The process utilizes a stable and durable metal mask. Resolution is high because of the low scattering angle of the high energy protons or alpha particles used to expose the sensitive material (resist). The process is fast for a given resist due to the availability of high fluxes over large area (flood beam) and the high energy loss rate of the particles in the resist. Metal, specifically beryllium, is preferred for the mask substrate because it has good mechanical characteristics and will dissipate heat more readily than some other materials, such as Mylar. However, other materials are usable.

The primary considerations for selecting a metal substrate are its structural (mechanical) strength and its electronic density. Good mechanical strength is required in order for the mask to be self-supporting and low electronic density reduces the scattering of the high energy particles. Since the electronic density is a function of the mass of the element and the mass density of the metal, the preferred metals are those with low mass and density. Based on these considerations, beryllium is considered the best metal. Its molecular weight of 9 is the lowest for a metal and its density of 1.85 g/cc is the lowest for a metal which is stable under normal atmospheric conditions. Other metals in order of preference are (1) Mg (magnesium) (subject to solving environmental problems), (2) Aluminum, and (3) Titanium.

For purposes of this application "resist" is used to describe any material whose molecular structure can be modified by exposure to radiation.

In FIG. 1, a semiconductor substrate 10 of silicon, has formed on the upper surface thereof an insulating layer 12 of silicon oxide. A layer of sensitive material (resist) 14 is affixed to the upper surface of the silicon oxide layer 12. The metal mask 11 having transparent (to alpha particles and protons) and nontransparent regions consisting of a beryllium foil (thin sheet like member) 16 and a layer 18 of patterned gold layer 18 affixed to the under surface of the beryllium foil 16 is positioned in overlying relationship with the resist layer 14. A flood beam of high energy particles, such as protons or alpha particles, as represented by arrows 20A through 20H is directed to impinge on the upper surface of the beryllium foil 16. The thickness of the beryllium foil 16 and the gold patterned layer 18 are selected so the combination of the beryllium foil 16 and the pattern gold patterned layer 18 substantially blocks the particles thereby preventing the particles from impinging on the underlying portions of the resist layer 18. However, the thickness of the beryllium foil 16 is sufficiently thin that the particles pass through the beryllium layer 16 and impinge on the underlying portions of the resist layer 14 with sufficient energy to change the molecular structure of the resist layer 14.

In selecting a metal for the patterned layer 18 the primary consideration is a metal having a high resistance to penetration by the high energy particles. Basically this means that the preferred metals are those having a high mass member and high atomic density. Additionally, the metal selected must be compatible with the substrate. Considering the current state of the art, the best metal is believed to be gold.

The particles impinging on the resist layer 14 cause the molecular structure of this layer to change. Molecular bonds are broken (sission) by the absorbed radiation, and in the absence of further reactions, resists of this type are characterized as a positive type resists. Alternatively, radicals formed by the broken bonds may experience subsequent reactions with neighboring polymer molecules to effect a crosslink and resists of this type are classified as negative type. Generally, both sission and cross-linking occur simultaneously in resist systems and classification (positive or negative) is assigned according to the dominant mechanism. This change in the molecular structure permits the resist layer 14 to be processed using selective dissolution to remove selected portions of the resist layer 14 to form a desired pattern in the resist layer 14. In addition to selective dissolution, complete depolymerization of materials such as Teflon, may facilitate selective removal by mechanical (brushing) methods.

After the resist layer 14 has been exposed and selected portions removed by selective dissolution, the remaining portion forms a protective mask on silicon oxide layer 12. The exposed portions of silicon oxide layer 12 can then be removed using conventional techniques. Additionally, the process can be used to delineate patterns in other materials and for other photolithographic process commonly used in the semiconductor art.

High energy particles is used to refer to particles in the range of 0.5 to 50 MeV. This range is primarily limited by the equipment available to generate the particles. Thus, the particle range may be extended by future developments in particle generators.

As an aid in illustrating how the thickness of the beryllium foil 16 and the pattern gold layer 18 are selected, FIG. 2 illustrates the penetration range of protons in gold, carbon and beryllium. For example, the curve 22 for beryllium indicates that protons having an energy of approximately 1 MeV will penetrate beryllium to a depth of about 14 microns. Similarly the curve 26 for gold indicates that protons having an energy of 1 MeV will penetrate gold to a depth of approximately 6 microns. In selecting the curves to illustrate in FIG. 2 for the purpose of aiding in the understanding of the invention, beryllium and gold were selected because these are the preferred materials for the mask previously discussed in FIG. 1. These curves permit one skilled in the art to select the proper thickness for the beryllium for 16 and the gold 18 (FIG. 1) to assure that the particles impinging on the resist layer 14 have the desired energy. Carbon was also included because it is known that the penetration characteristics of carbon closely resembles those of most commercial resists utilized in the semiconductor industry and the curves for carbon are available while those for commercial resists are not. Under these circumstances the curve for carbon is included to illustrate generally the penetration range of these particles in commercial resist such as COP which is commercially available from Mead Chemical Company. It is necessary to know the characteristics of the resist so that the thickness of the foil 16, the thickness of the patterned gold layer 18 and the energy of the particles can be selected such that the molecular structure of the resist layer 14 will be changed.

Figure 3:
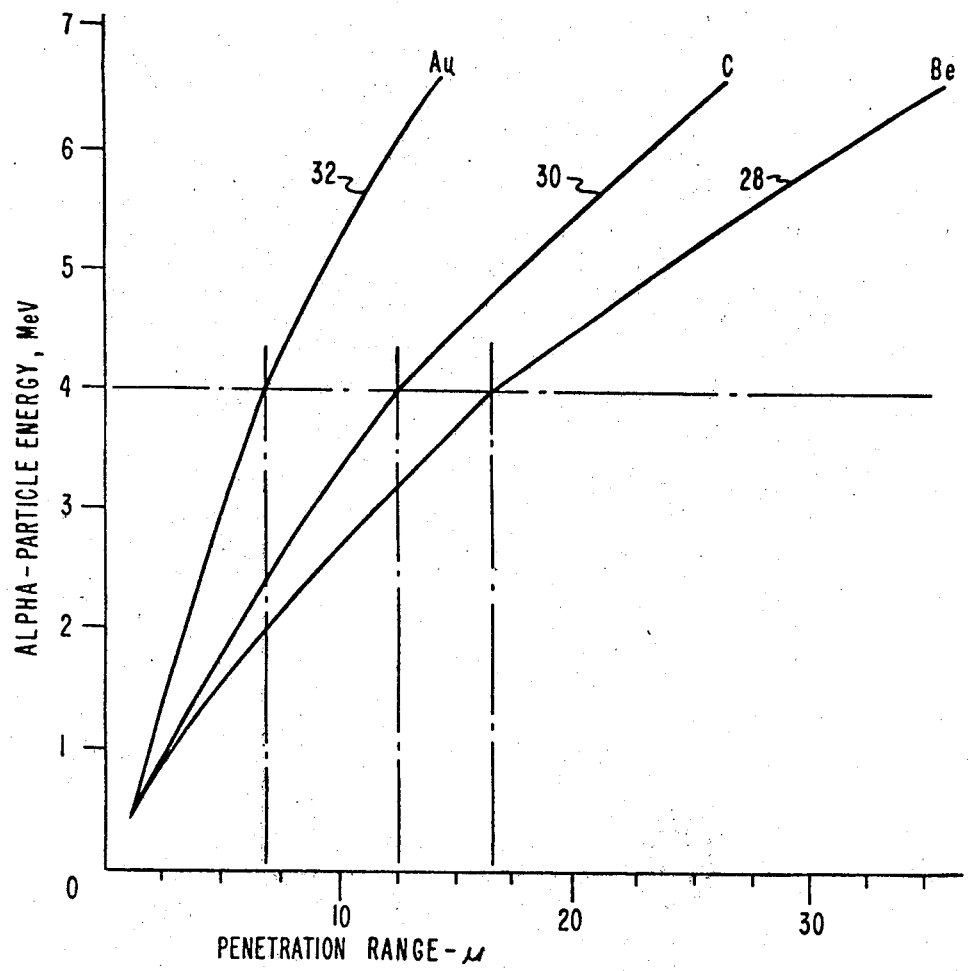
FIG. 3 is a diagram illustrated in the penetration range of alpha particles in beryllium, carbon and gold.

FIG. 3 is a series of curves illustrating the penetration range of alpha particles in beryllium, carbon and gold. For example, a curve 28 indicates that alpha particles having an energy range of approximately 4 MeV will penetrate beryllium to a depth of approximately 17 microns. Similarly, the energy loss in each 7 microns of gold is also approximately 4 MeV. As illustrated by curve 32, alpha particles having an energy of 4 MeV will penetrate gold to a depth of only about 7 microns. Put another way, the energy loss in each 17 microns of beryllium is approximately 4 MeV. Using these curves one skilled in the art can select the proper thickness for the beryllium foil 16 and the gold 18 (FIG. 1) and the proper energy level for the alpha particles. As in the previous example, the curve for carbon is included in this drawing as being representative of the penetration depth of alpha particles in resist. This is also done as a matter of convenience because the curves for carbon are readily available while those for resist would have to be determined experimentally. It is also known in the art that the penetration characteristics of carbon and most commercial photoresists are relatively close. Thus, the penetration curve 34 carbon is included as being generally representative of the penetration curve for commercial photoresist.

Utilizing the curves illustrated in FIGS. 2 and 3, it has been found that a suitable thickness for the beryllium layer illustrated in FIG. 1 is approximately 1 mil. Similarly, the pattern gold layer can be approximately 1 micron thick. The energy of the particles (alpha particles or protons is then selected to achieve the desired penetration range in the resist layer 14. Utilizing this type of structure the mask comprising the beryllium and gold is relatively rigid and can be easily handled. It is also very durable permitting it to be utilized almost indefinitely. This is a great improvement over the fragile mask previously discussed and commonly used with ultraviolet type photo lithographic processes.

A parallel (flood) beam of protons and alpha particles, which are considerably more massive than electrons and will undergo relatively insignificant changes in direction after interactions with atomic electrons while traversing a material. However, after multiple scattering, the deflections will become measurable with respect to the original direction and will set the lower limit on this form of lithography. For the determination of these limits, refer to FIG. 4 which is a fragmentary cross-section view of the mask consisting of a 1 mil beryllium foil and 1 micron gold overlying a 1 micron thick layer of resist. These dimensions are typical of those utilized in the disclosed process. Utilizing this view, the angle $\theta$ can be calculated from multiple scattering theory. Angle $\theta$ is an angle within which 96% of the particles will be scattered for particles entering any point on the beryllium surface. From FIG. 4, it is apparent that this angle will determine the amount of undercutting beneath the gold layer 18 and the resolution of the process. The width of the undercut is identified by dimension D. Using well known mathematical formulas the angle $\theta$ is approximately 1 degree and 32 minutes for protons and 0 degrees and 18 minutes for alpha particles. This results in the distance D being 0.08 microns for protons and and 0.016 microns for alpha particles. These figures are to be contrasted to resolution ranges of 1 to 5 microns using conventional ultraviolet lithographic processes.

Figure 5:
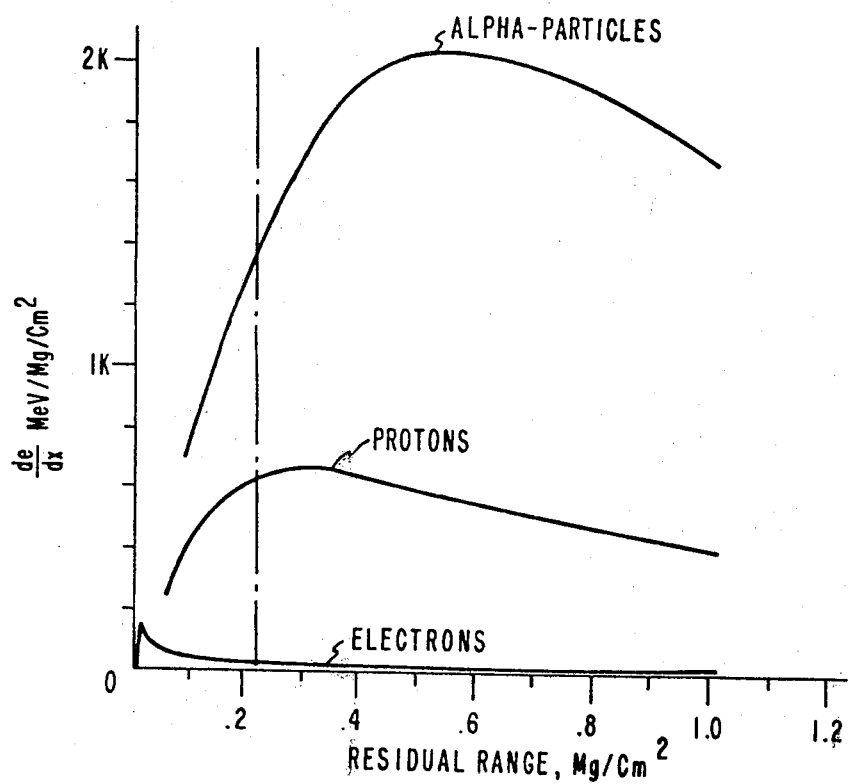
FIG. 5 is a diagram illustrating the energy loss as a function of the residual range for electrons, protons and alpha particles.

FIG. 5 is three curves illustrating the energy loss rate for alpha particles protons and electrons as a function of the residual range. These curves are important because of the rate of energy loss of the particles determines the speed at which the molecular structure resist is altered. In FIG. 5 curves have been included for electrons, protons and alpha particles. From these curves it is clear that the highest energy loss rate is for alpha particles followed by protons and electrons. Thus, it is clear that the energy loss rates for alpha particles and protons is far superior to the loss rate for electrons. Additionally, the protons and alpha particles can be easily generated using commercially available equipment. Alpha particles and protons also have the capability of high resolution, as previously described.

Figure 6:
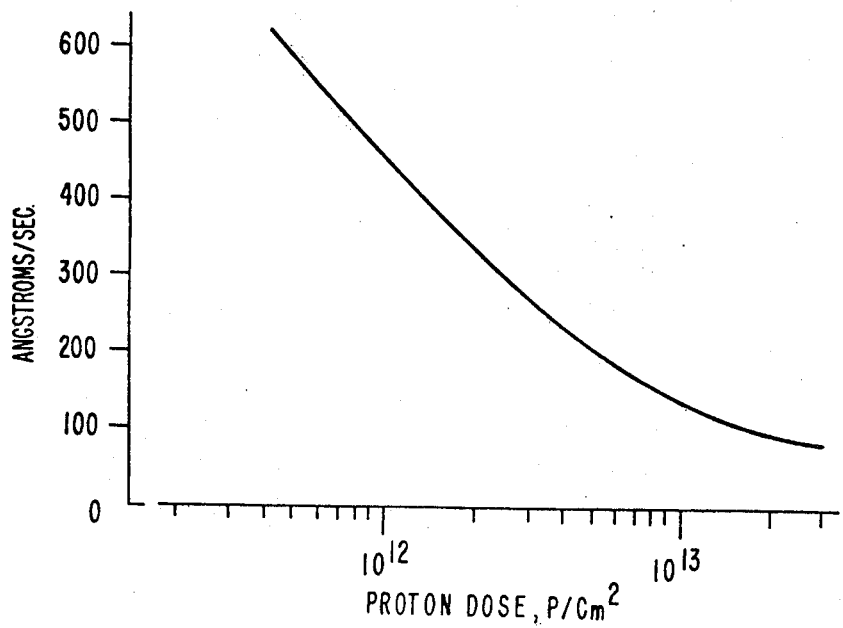
FIG. 6 is a curve illustrating the dissolution rate of the resist.

FIG. 6 is a curve of the dissolution rate for resist versus the proton dose rate. From this curve, it can be seen that a dissolution rate of 100 angstroms per second can be achieved for a radiation dose of approximately $10^{13}$ protons per $cm^2$. This clearly illustrates that the disclosed process not only has the possibility of improving resolution, it can be very rapid.

The dissolution rate is also high for practical dose rates of alpha particles.

FIG. 7 is a fragmentary view of a test pattern which was utilized to demonstrate the invention. The portion of the test pattern consists of groups six and seven of a standard test pattern known as "USAF 1951". The test pattern confirmed that the process was operable.

In demonstrating a proton flood beam and a mask consisting of a Mylar foil and a patterned gold layer affixed thereto was used because an all metal mask as described above was not available.

Although the invention has been described with reference to protons and alpha particles, other particles may also be used. However, in the semiconductor art, protons and alpha particles have particular advantages in that, (1) the mass is sufficient to reduce the error due to scattering to a low value but low enough that they will penetrate a mask of reasonable thickness with a reasonable initial energy; (2) when these particles acquire an electron they become gases (helium and hydrogen) which do become a part of the semiconductor crystal structure; (3) any crystal damage in the semiconductor is limited to dislocation near the surface. These dislocations may be reduced or removed using known semiconductor processes.

Other possible high energy particles include the ion of nitrogen and the nobel gas. However, it is believed that these particles may result in a mask which is thin and fragile. Oxygen ions might also be used. However, these ions might chemically combine with the semiconductor. Electrons are also useable. However, the resolution is less because of increased scattering due to a lower mass per particle.

Additionally, the mask may be used with the patterned metal foil (beryllium in the preferred embodiment) adjacent the resist layer. However, this modification will probably reduce the resolution because most of the scattering occurs in the foil.

We claim:

1. A method for processing a resist layer to produce a selected pattern therein, comprising the steps of:
    (a) positioning a metal mask having at least a first region impervious to particles of a selected energy and at least a second region transparent to particles of said selected energy in overlying and contacting relationship with said resist layer;
    (b) bombarding said mask with particles having said selected energy thereby changing the molecular structure of portions resist layer which underlie said transparent portions such that portions of said resist layer can be selectively removed to produce said pattern.

2. A method of processing a resist layer to produce a selected pattern therein in accordance with claim 1 wherein said selected particles are alpha particles.

3. A method of processing a resist layer to produce a selected pattern therein in accordance with claim 1 wherein said particles are protons.

4. A method of processing a resist layer to produce a selected pattern in accordance with claim 1 wherein said transparent region comprises a foil of a first selected metal.

5. A method of processing a resist layer to produce a selected pattern in accordance with claim 1 wherein said impervious region comprises a foil of a first selected metal and a layer of a selected second metal affixed to one surface of said foil.

6. A method of processing a resist layer to produce a selected pattern therein in accordance with claim 4 wherein said first selected metal is beryllium.

7. A method of processing a resist layer to produce a selected pattern therein in accordance with claim 6 wherein said second selected metal is gold.

8. A method for forming a patterned layer on a surface comprising the steps of:
    (a) forming a layer of resist on said surface;
    (b) positioning a metal mask having at least a first region impervious to particles of a selected energy and at least a second region transparent to particles of said selected energy in overlying and contacting relationship with said resist layer;
    (c) bombarding said mask with a flood beam of particles, thereby selectively changing the molecular structure of first selected portions of said resist layer; and
    (d) removing selected portions of said resist layer to produce said patterned layer.

9. A method for forming a patterned layer on a surface in accordance with claim 8 wherein said portion of said resist layer having a changed molecular structure are removed to produce said pattern.

10. A method for forming a patterned layer on a surface in accordance with claim 8 wherein the portions of said resist layer having an unaltered molecular structure are removed to produce said patterned layer.

11. A method for processing a resist layer to produce a selected pattern therein, comprising the steps of:
    (a) positioning a metal mask, said mask comprising a beryllium foil and a patterned gold foil affixed thereto, in overlying relationship with said resist layer;
    (b) bombarding said mask with particles having a selected energy thereby changing the molecular structure of portion of said resist layer which underlie transparent regions of said mask such that portion of said resist layer can be selectively removed.

12. A method for processing a resist layer to produce a selected pattern in accordance with claim 11 wherein said particles are high energy $\alpha$ particles.

13. A method for processing a resist layer to produce a selected pattern in accordance with claim 11 wherein said particles are protons.

* * * * *